United States Patent

[11] 3,608,029

[72] Inventor Arthur Joseph Hough
Shelton, Conn.
[21] Appl. No. 806,744
[22] Filed Mar. 12, 1969
[45] Patented Sept. 21, 1971
[73] Assignee Vitramon Incorporated
Monroe, Conn.

[54] PROCESS FOR ENCAPSULATING ELECTRONIC COMPONENTS
2 Claims, 3 Drawing Figs.

[52] U.S. Cl. ........ 264/112,
264/128, 264/272, 29/627
[51] Int. Cl. ........ B29C 6/02
[50] Field of Search ........ 264/112,
128, 272, 279; 29/627

[56] References Cited
UNITED STATES PATENTS

| | | | |
|---|---|---|---|
| 2,787,652 | 4/1957 | Kelsay | 264/272 X |
| 2,850687 | 9/1958 | Hammes | 264/272 X |
| 3,056,704 | 10/1962 | Rothweiler | 264/272 X |
| 2,899,611 | 8/1959 | Bradley | 264/272 X |

*Primary Examiner*—Robert F. White
*Assistant Examiner*—T. S. Carvis
*Attorney*—Arnold Grant

ABSTRACT: The present invention relates to a process for encapsulating electronic components in protective casings. More particularly, the component is placed in the case and the space between the walls of the case and the component filled with mineral beads having a thermal coefficient of expansion approximating that of the component. Holes are then drilled in two sides of the case and the case is placed in a container of liquid epoxy. Capillary attraction forces the epoxy in through one set of holes in the case, driving air out through the other set. After the case is filled with epoxy and devoid of air, it can be baked to harden the epoxy.

INVENTOR
ARTHUR J. HOUGH
BY Arnold Grou
ATTORNEY

PROCESS FOR ENCAPSULATING ELECTRONIC COMPONENTS

BACKGROUND OF THE INVENTION

The present invention relates to a process for encapsulating electronic components in protective casings. Electronic components, especially miniature and microminiature components, are extremely sensitive to their environment. Temperature, humidity, the presence of dust and severe handling, etc., can both individually and collectively effect the operating performance and characteristics of a component.

One of the methods that the art has evolved for overcoming this problem is to encapsulate the particular component or group of components in a protective casing. The components are placed in the casing with the space between the exterior walls of the component and the interior walls of the casing most often being filled with wax, plastic or tar. While this solution is effective in that it does protect the component from humidity and dust, it does not provide sufficient thermal insulation to effectively protect the more temperature-sensitive components.

For extremely temperature-sensitive components, the most effective insulating filler material, between component and casing, is an epoxy, especially the anhydride epoxies. However, when using an epoxy the problem arises of matching the thermal coefficient of expansion of the epoxy with that of the materials in the component. If the thermal coefficients are different, one will have to dominate the other, resulting in cracking or chipping of the dominated material. Those working in this art have, to an extent, been successful in overcoming this difficulty by making the insulating-filler material a mixture comprised mainly of mineral beads having a thermal coefficient compatible with that of the component and offering good thermal protection and an epoxy as both a binder for the mineral beads and to maximize thermal protection.

They have been only partially successful because the mineral beads and epoxy are not a compatible mixture, i.e., the beads will not evenly distribute themselves in the epoxy but separate into a distinct layer. Thus, if the beads are introduced into the epoxy and the mixture poured into the casing, the beads will rapidly separate from the epoxy before the epoxy can be cured, resulting in ineffective environmental protection and physical distortion caused by different thermal coefficients of expansion. Attempts at changing the viscosity of the epoxy so as to retain the beads in suspension make the mixture very difficult to pour and result in a case filled with residual air pockets.

The present invention overcomes these difficulties by a process comprising placing at least one component in a protective case having a set of holes in a first wall and at least one other set of holes in at least one other wall; filling the space between the interior walls of the case and the exterior walls of the components with a first material in granular form having an average diameter larger than the diameter of the holes in the first wall of the case and a thermal coefficient of expansion compatible with that of the components; placing the case with the first wall as the lowermost surface in a zone having therein a second material in liquid form, the liquid level in the zone being below the uppermost surface of the case when the case is in the zone; filling the voids between the first granular material in the case with the second material by capillary action, the second material rising through the set of holes in the first wall to fill the case; and, sealing and curing the case to solidify the second material.

DESCRIPTION OF THE DRAWINGS AND THE INVENTION

The subject matter which applicant regards as his invention is particularly pointed out and distinctly claimed in the concluding portion of this specification. The invention, however, as to its organization and method of operation together with further objects and advantages thereof will best be understood by reference to the following description taken in conjunction with the accompanying drawings in which:

Figure 1:
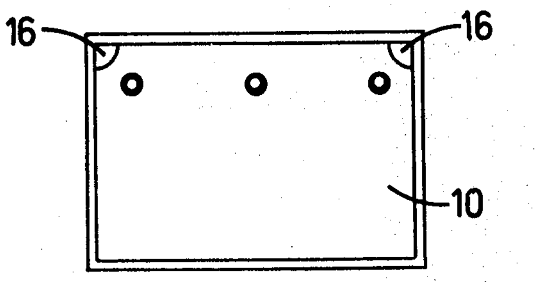
FIG. 1 is a plan view of a protective casing prepared according to the present invention.
Figure 2:
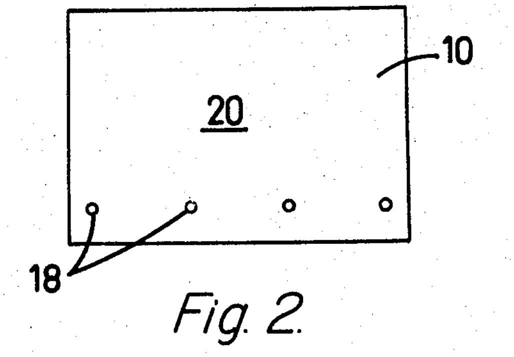
FIG. 2 is a bottom view of a protective casing prepared according to the present invention; and, FIG. 3 is a view in section showing the process of the present invention.
Figure 3:
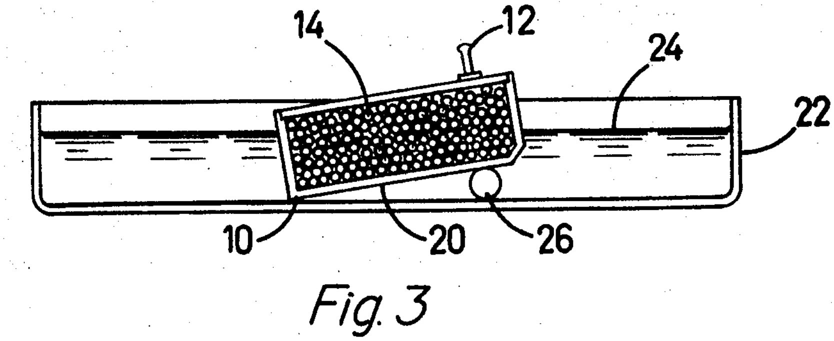

Referring now to the drawings, an electronic component or group of components (not shown) are placed in a hollow casing 10, usually formed of plastic, to protect the electrical characteristics and performance of the components from the effects of temperature, humidity, dust and shock, etc. If more than one component is placed in the case they may be interconnected in a manner well known in the art, such as internal wiring or a lead frame (not shown).

As discussed above, the problem solved by the present invention is how to utilize an epoxy as the insulating-filler material for the space between the exterior walls of the components and the interior walls of the protective case. The problem is, essentially, twofold; first, epoxies as a class, have a different thermal coefficient of expansion than most electrical components, making them, as a class, unsuitable for close contact use with these electrical components. Second, the most practicable solution, i.e., a mixture of a first material having a thermal coefficient of expansion compatible with that of the component and an epoxy, does not readily lend itself to this particular use because of the difficulty involved in suspending the first material in the epoxy long enough to produce a uniform cross section once the case is cured.

The process of the present invention incorporates the principle of capillary attraction to solve the problem. Capillarity, is the attraction between molecules, both similar and dissimilar, which results in the rise of a liquid in small tubes or fibers, or in the wetting of a solid by a liquid. According to the present process, the space between the component and the case is filled with a granular material 14 having a thermal coefficient of expansion compatible with that of the component. For example, if porcelain capacitors were in the case then granules of aluminum oxide could be used as the filler material. Granules having an average diameter much smaller than 1/62 inch means that the entrance for the epoxy, discussed hereinafter, will be too small for effective introduction of epoxy into the case 10. On the other hand, using granules larger than 1/16-inch diameter results in too much epoxy in the mixture and could result in chipping and cracking caused by the dominant thermal coefficient of expansion of the epoxy.

The granular filler material 14 can be added to the case 10 directly after the component and then the case sealed; or, alternatively, the case can be sealed after placement of the component and holes 16, which have further use hereinafter as air vents, can be drilled or preformed through a wall of the case and the filler material added through the holes. Which ever procedure is used, the object is to maximize the quantity of the granular filler material. Once this is done, a series of epoxy entrance holes 18 are drilled through another wall of the case. As with the vent holes 16, entrance holes 18 can be predrilled in the wall of the case 10. These holes must be smaller than the diameter of the granular filler material, to prevent escape of the granular filler material and are preferably in a wall 20 opposite to that of the vent holes 16.

The case 10 is then placed in a container 22 of liquid epoxy 24, with the epoxy entrance holes 18 being on the lowermost surface of the case. Preferably, the liquid level is approximately ½–¾ of the way up the side walls of the case 10. A jig 26 may be used to position the case in the epoxy and insure that entrance holes 18 are free to pass epoxy. Capillary attraction draws the epoxy into the case and fills the voids in the case between the granules of filler material 14, driving the air out the vent holes 16. A dye may be used in the epoxy as a determinant of when the case is filled.

The case can then be removed and cured in a manner well known in the art. What results is a component completely protected against the environment and physical handling by an epoxy based filler material.

As this invention may be embodied in several forms without departing from the spirit or essential character thereof the present embodiments are illustrative and not restrictive. The scope of the invention is defined by the appended claims rather than by the description preceding them, and all embodiments which fall within the meaning and range of equivalency of the claims are, therefore, intended to be embraced by those claims.

I claim:

1. A process for encapsulating electronic components in protective casings comprising placing at least one component in a protective case having a set of holes in a first wall and at least one other set of holes in at least one other wall; filling the space between the interior walls of the case and the exterior walls of the component with a first material in granular form having an average diameter larger than the diameter of the holes in the first wall of the case, and between 1/62 and 1/16 inch, and a thermal coefficient of expansion compatible with that of the components; placing the case with the first wall as the lowermost surface in a zone having therein a second, epoxy, material in liquid form, the liquid level in the zone being one-half to three-quarters of the distance between the lowermost surface and the uppermost surface of the case when the case is in the zone; filling the voids between the first granular material in the case with the second material by capillary action, the second material rising through the set of holes in the first wall to fill the case; and, sealing and curing the case to solidify the second material.

2. The process as in claim 1 wherein there is at least one set of holes in a wall of the case opposite the first wall.